United States Patent
Han et al.

(10) Patent No.: US 7,064,420 B2
(45) Date of Patent: Jun. 20, 2006

(54) INTEGRATED CIRCUIT LEADFRAME WITH GROUND PLANE

(75) Inventors: Byung Joon Han, Singapore (SG); Byung Hoon Ahn, Singapore (SG); Zheng Zheng, Singapore (SG)

(73) Assignee: St Assembly Test Services Ltd., Singapore (SG)

( * ) Notice: Subject to any disclaimer, the term of this patent is extended or adjusted under 35 U.S.C. 154(b) by 218 days.

(21) Appl. No.: 10/444,849

(22) Filed: May 23, 2003

(65) Prior Publication Data

US 2004/0061204 A1   Apr. 1, 2004

Related U.S. Application Data

(60) Provisional application No. 60/415,330, filed on Sep. 30, 2002.

(51) Int. Cl.
*H01L 23/495* (2006.01)
*H01L 21/48* (2006.01)
*H05K 7/20* (2006.01)
*H01R 43/00* (2006.01)

(52) U.S. Cl. ............... 257/669; 257/670; 257/676; 257/692; 257/784; 361/723; 361/773; 361/813; 438/123; 29/827

(58) Field of Classification Search .............. 257/666, 257/669–670, 672, 674
See application file for complete search history.

(56) References Cited

U.S. PATENT DOCUMENTS

| | | | | |
|---|---|---|---|---|
| 4,803,540 A | * | 2/1989 | Moyer et al. | 257/669 |
| 5,381,037 A | | 1/1995 | Olivarez | 257/666 |
| 5,814,877 A | | 9/1998 | Diffenderfer et al. | 257/666 |
| 6,380,048 B1 | | 4/2002 | Boon et al. | 438/456 |
| 6,437,427 B1 | | 8/2002 | Choi | 257/666 |
| 6,630,373 B1 | * | 10/2003 | Punzalan et al. | 438/123 |
| 6,828,659 B1 | * | 12/2004 | Iwakiri | 257/666 |
| 6,876,069 B1 | * | 4/2005 | Punzalan et al. | 257/676 |
| 2001/0035569 A1 | | 11/2001 | Shibata | 257/667 |

FOREIGN PATENT DOCUMENTS

| | | |
|---|---|---|
| EP | 0902473 A2 | 3/1999 |
| EP | 0706213 A2 | 4/2006 |
| JP | 63169753 A | 7/1988 |
| JP | 10004171 A | 6/1998 |
| WO | WO 01/09953 A1 | 2/2001 |

* cited by examiner

*Primary Examiner*—Alonzo Chambliss
(74) *Attorney, Agent, or Firm*—Mikio Ishimaru

(57) ABSTRACT

A leadframe for a semiconductor package includes signal and ground leads, a ground plane, and a frame paddle. Supports connect the signal and ground leads, ground plane, and frame paddle in at least two different layers. At least one force release and stress relief structure is incorporated into the leadframe to free the ground plane substantially from distortion and warpage resulting from residual mechanical stresses therein.

20 Claims, 5 Drawing Sheets

INTEGRATED CIRCUIT LEADFRAME WITH GROUND PLANE

CROSS-REFERENCE TO RELATED APPLICATION(S)

This application claims the benefit of U.S. Provisional Patent Application Ser. No. 60/415,330 filed Sep. 30, 2002, and the subject matter thereof is hereby incorporated herein by reference thereto.

The present application contains subject matter related to a co-pending U.S. Provisional Patent Application Ser. No. 60/415,227 filed Sep. 30, 2002, and the subject matter thereof is hereby incorporated herein by reference thereto.

The present application also contains subject matter related to a concurrently filed U.S. patent application by Byung Joon Han and Byung Hoon Ahn entitled "MOISTURE RESISTANT INTEGRATED CIRCUIT LEADFRAME PACKAGE". This application is Ser. No. 10/446,275, and the subject matter thereof is hereby incorporated herein by reference thereto. This related patent application is assigned to ST Assembly Test Services Ltd.

TECHNICAL FIELD

The present invention relates generally to integrated circuits, and more particularly to leadframes for integrated circuits.

BACKGROUND ART

In the electronics industry, the continuing goal has been to reduce the size of electronic devices, such as camcorders and portable telephones, while increasing performance and speed. Integrated circuit packages for complex electronic systems typically have a large number of interconnected integrated circuit chips. The integrated circuit chips are usually made from a semiconductor material such as silicon or gallium arsenide. The various semiconductor devices on the integrated circuit chips are formed in various layers on the chips using photolithographic techniques. After manufacture, the integrated circuit chips are typically incorporated into packages that are then mounted on printed circuit wiring boards.

Integrated circuit chip packages typically have numerous external pins that are mechanically attached by solder or a variety of other known techniques to conductor patterns on the printed circuit wiring boards.

Typically, the packages in which these integrated circuit semiconductor chips are mounted include a substrate or other chip mounting device. One example of such a substrate is a leadframe. High performance leadframes typically are multi-layer structures including power, ground, and signal layers on separate planes.

Leadframes also typically include an area on which a semiconductor integrated circuit chip is mounted and in which a number of power, ground, and/or signal leads is attached to the semiconductor integrated circuit chip. In particular, the power, ground, and/or signal leads of the leadframe are connected electrically to power, ground, and/or signal sites on the integrated circuit semiconductor chip.

Semiconductor integrated circuit chips may be attached to the leadframe using adhesive or any other appropriate techniques for attaching such chips to a leadframe. Techniques commonly known to those skilled in the art for attaching such chips to a leadframe, for example, include soldering.

Once the integrated circuit chip(s) are attached mechanically and electrically to the leadframe, the leadframe may be enclosed or encapsulated in a protective enclosure. Such enclosures may include encapsulation in a plastic or a multi-part housing made of plastic, ceramic, or metal. The enclosure may protect the leadframe and the attached chip from physical, electrical, moisture, and/or chemical damage.

The leadframe and attached chip(s) may then be mounted on, for example, a circuit board or card along with other leadframes or devices. The circuit board or card may then be incorporated into a wide variety of devices such as computers, cellular telephones, automobiles, appliances, and so forth.

Typical known leadframes that include a number of layers on different planes are complex and expensive to produce. Multiple planes have been incorporated into the design of many leadframes as a solution to accommodate the high density of leads needed for the highly complex integrated circuits typically used today.

In many such multiple plane designs, each plane has a single function, such as ground, power, or signal. The separation of the functions in the different planes is to help electrically isolate the various planes in order to reduce electrical interference, such as noise, from one plane to another.

Unfortunately, even when the layers are built up using known techniques, such multi-layer leadframes, although functionally effective, are very complex and often are not cost effective.

Another problem with these multi-layer leadframes is that the ground plane preferably must be in a different layer from the semiconductor chip mounting structure, such as a die attach or mounting paddle. Single and double downsetting and upsetting methods have been developed to accomplish this. However, these methods cause mechanical stress on the ground plane and result in ground plane distortion or warp.

The ground plane distortion or warp prevents the ground plane from sitting flat on a wire bonding heater block and causes bouncing of the ground plane during the wire bonding process, resulting in poor ground bonding integrity.

Solutions to problems of this sort have been long sought, but have long eluded those skilled in the art.

DISCLOSURE OF THE INVENTION

The present invention provides a leadframe for a semiconductor package. The leadframe includes signal and ground leads, a ground plane, and a frame paddle. Supports connect the signal and ground leads, ground plane, and frame paddle in at least two different layers. At least one force release and stress relief structure is incorporated into the leadframe to free the ground plane substantially from distortion and warpage resulting from residual mechanical stresses therein. This results in improved bonding integrity during wire bonding processes.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
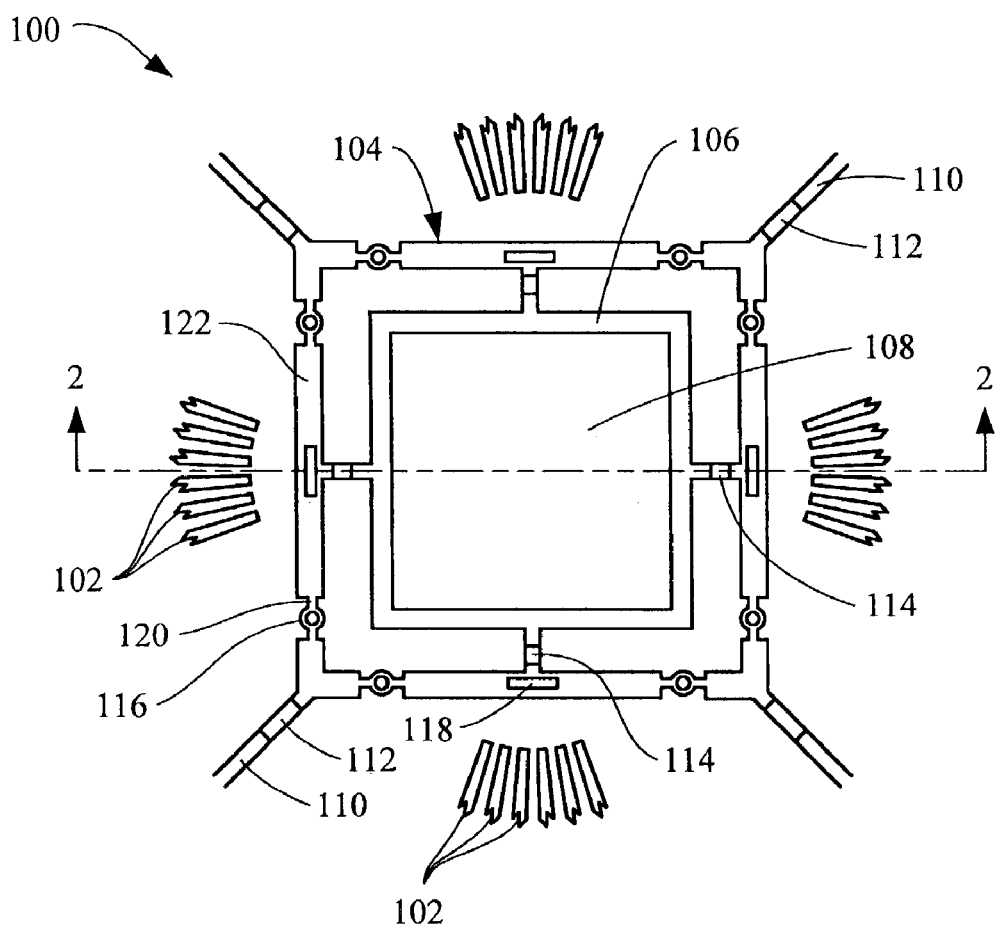
FIG. 1 is a plan view of a leadframe for an integrated circuit incorporating force release and stress relief features according to the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGS.

The term "horizontal" as used herein is defined as a plane parallel to the conventional plane or surface of the semiconductor die mounting paddle, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1, therein is shown a plan view of a leadframe 100 for an integrated circuit. The leadframe 100 includes three principal layers on three different levels or planes. Initially formed from a single flat sheet of material, usually metal, these several functional layers are fabricated, preferably, in a single stamping, cutting, and forming process.

In the topmost layer or plane is located a number of signal leads 102. In the intermediate layer or plane is located a ground plane structure that, in the embodiment illustrated in FIG. 1, is a bonding ring 104.

In the lower or bottom layer or plane is located a frame paddle 106 that serves as a mounting pad for a semiconductor device, such as a die 108, for mounting and supporting the die 108 on the leadframe 100.

The bonding ring 104 and the frame paddle 106 are supported from ground leads 110 that, at their distal extents, are in the same upper plane as the signal leads 102. Then, to reach the intermediate plane of the bonding ring 104, each ground lead 110 has a first downset 112 formed therein connecting to the bonding ring 104.

To connect the frame paddle 106 to the bonding ring 104, second downsets 114 are provided at several locations therebetween, as illustrated. Together, the downsets 112 and 114 form supports for the elements of the leadframe 100, supporting and holding them in their respective layers or planes. Similarly, the downsets and upsets described later herein serve as supports that hold the various leadframe elements in their respective layers or planes.

It has been discovered that the metal forming operation that bends and forms the first downsets 112 and the second downsets 114 causes mechanical stresses, particularly on the bonding ring 104, that leave residual distortions and warpage therein. In prior art devices, such residual stresses and distortions have led to poor ground bonding integrity when electrical connections were made between the semiconductor device, such as the die 108, and the bonding ring 104. For example, ground plane warpage interferes with achieving the proper physical contact between the ground plane bonding ring and a wire bonding heater block, causing bouncing during conventional wire bonding processes.

To overcome these prior art problems, the present invention incorporates force release and stress relief structures and features for the bonding ring 104. In particular, and as illustrated in FIG. 1, the bonding ring 104 includes a number of open rings 116 and slots 118 therein. These are located and distributed throughout the bonding ring 104 as appropriate for relieving residual stresses therein. For example, as shown in FIG. 1, each branch of the bonding ring 104 is separated by an open ring 116 from the first downset 112 connected thereto. Similarly, a slot 118 is provided in the bonding ring 104 at each location where a second downset 114 is attached thereto. Additionally, the open rings 116 are connected to the bonding ring 104 by necks 120.

Between the necks 120 and the slots 118 are the major extents 122 of the bonding ring 104. The major extents 122 are the portions of the bonding ring 104 to which ground wire connections from the die 108 to the bonding ring 104 are made, as further described below with respect to FIG. 2.

The open rings 116 and the necks 120 are much narrower in transverse material extent than the major extents 122 of the bonding ring 104. Similarly, the slots 118 cause the actual amount of transverse material at each slot to be greatly reduced. These regions of narrowed transverse material are much weaker, or less stiff, than the major extents 122 of the bonding ring 104, and therefore preferentially flex and yield, releasing and absorbing the residual stress forces in the bonding ring 104. They also help to prevent such forces from being transmitted to the major extents 122 during the metal forming operations for the leadframe 100. The result is a significant reduction in residual distortions in the major extents 122 of the bonding ring 104.

Figure 2:
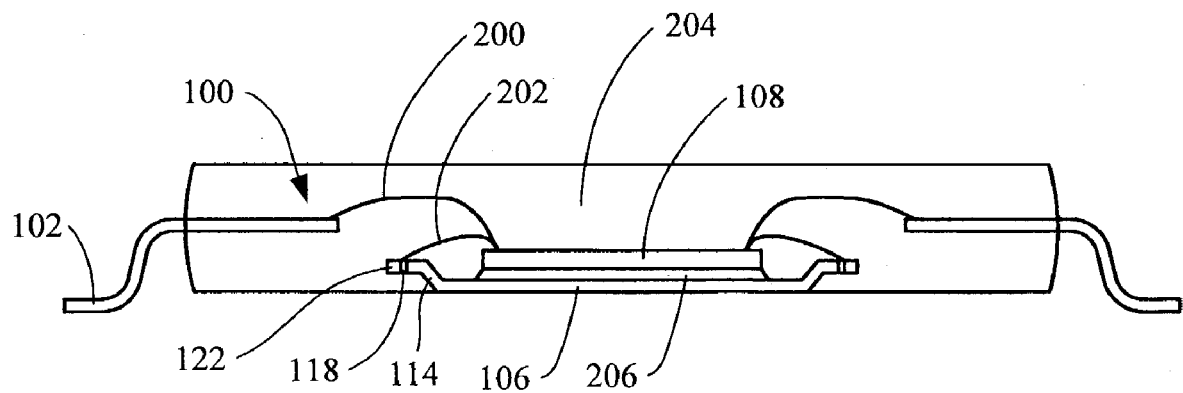
FIG. 2 is a cross-sectional view of the structure of FIG. 1 taken generally on line 2—2 of FIG. 1.

Referring now to FIG. 2, therein is shown a cross-sectional view of the structure of FIG. 1, taken generally on line 2—2 thereof. In addition, FIG. 2 illustrates the full extent of the signal leads 102, and shows the leadframe 100 in a final state of manufacture in which signal wires 200 have been bonded to the signal leads 102 and connected to the die 108, ground wires 202 have been bonded to the major extents 122 of the bonding ring 104 (FIG. 1) and connected to the die 108, and an encapsulating body 204, such as a molded resin, has been formed therearound. Also shown is an adhesive 206 that bonds the die 108 to the frame paddle 106.

Figure 3:
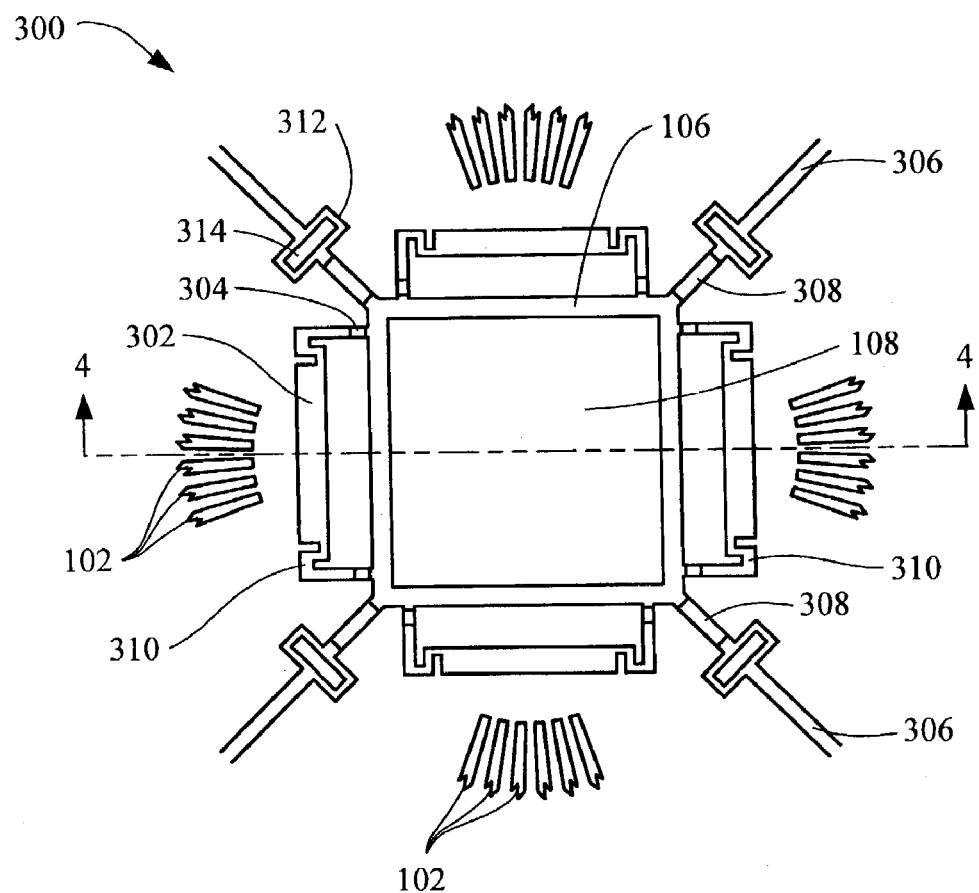
FIG. 3 is a plan view of a leadframe incorporating an alternative set of force release and stress relief features in accordance with the present invention.

Referring now to FIG. 3, therein is shown a leadframe 300 that incorporates alternative force release and stress relief structures. For clarity and ease of illustration and description of this and other embodiments disclosed herein, like features one to another are described with like reference numerals. Thus, for example, the leadframe 300 includes the signal leads 102, the frame paddle 106, and the die 108 mounted on the frame paddle 106. However, rather than a surrounding bonding ring, the leadframe 300 has a ground plane structure comprising grounding tabs 302 extending laterally away from the frame paddle 106. The grounding tabs 302 are positioned in the intermediate layer level by upsets 304 that connect the grounding tabs 302 to the frame paddle 106.

The leadframe 300 also includes ground leads 306 that are similar to the ground leads 110 (FIG. 1) in the leadframe 100 (FIG. 1). However, unlike the ground leads 110, the ground leads 306 are connected directly to the frame paddle 106 by deep downsets 308. The deep downsets 308 are considered "deep" because they traverse the height of more than one layer or plane of the leadframe, in this case extending directly from the top signal leads layer to the bottom frame paddle layer.

A typical metal forming operation for a leadframe such as the leadframe 300 will involve, for example, mechanically pushing the frame paddle 106 down through two layer levels and mechanically pushing the grounding tabs 302 up one level in the reverse direction, into the final three layer configuration. To release the forces and residual stresses from such a metal forming operation, the leadframe 300 includes Z-links 310 and box slots 312. The box slots 312, which have an open center or slot 314, are positioned on the ends of the ground leads 306 nearest the deep downsets 308, connecting them together. The Z-links 310 are positioned on each end of each grounding tab 302, connecting the grounding tabs 302 to the upsets 304.

The Z-links 310 comprise a zigzag pattern of reduced transverse extent material, thereby being rendered more flexible. The dynamic effect is similar to that of the reduced transverse extent material that forms the open rings 116 (FIG. 1) and the material around the slots 118 (FIG. 1) in the leadframe 100 (FIG. 1). Being more flexible, the material in the Z-links 310 thus preferentially bends and deforms to absorb the residual forces from the metal formation processes that cut and shaped the leadframe 300, allowing the grounding tabs 302 to remain desirably flat and planar.

Similarly, the box slots 312 afford a connection having a lengthened linear extent of narrower transverse extent material that, as with the Z-links 310, provides a long path of more flexible material to absorb the residual forces and to provide stress relief from the metal formation processes that formed the leadframe 300.

Figure 4:
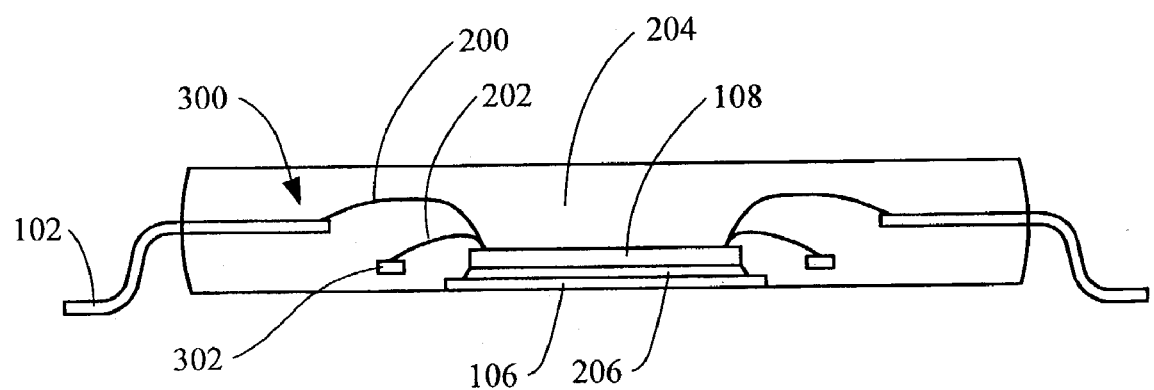
FIG. 4 is a cross-sectional view of the structure of FIG. 3 taken generally on line 4—4 of FIG. 3.

Referring now to FIG. 4, therein is shown a cross-sectional view of the structure of FIG. 3, taken generally on line 4—4 thereof. In addition, FIG. 4 illustrates the full extent of the signal leads 102, and shows the leadframe 300 in a final state of manufacture in which the signal wires 200 have been bonded to the signal leads 102 and connected to the die 108, the ground wires 202 have been bonded to the grounding tabs 302 and connected to the die 108, and the encapsulating body 204 has been formed therearound.

Figure 5:
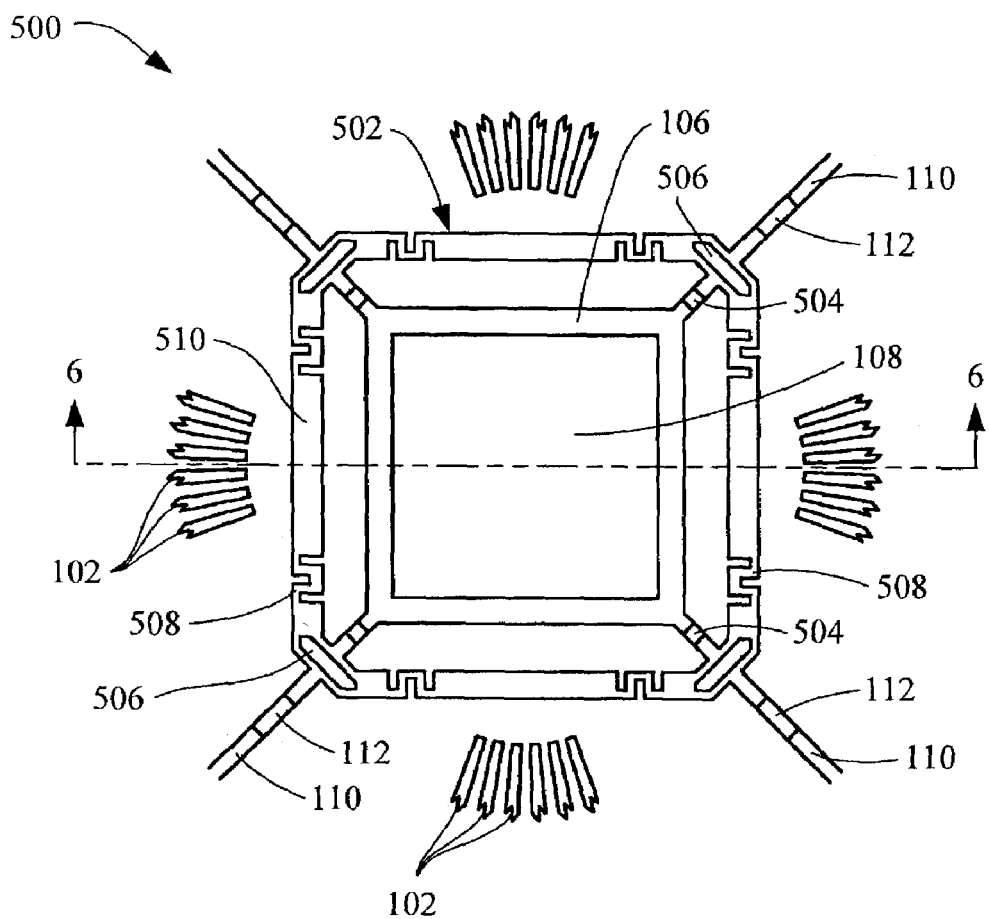
FIG. 5 is a plan view of a leadframe incorporating further alternative force release and stress relief features in accordance with the present invention.

Referring now to FIG. 5, therein is shown a leadframe 500 according to the present invention. The leadframe 500 is another configuration that incorporates force release and stress relief features into a multi-layer leadframe. In this configuration, the ground plane level structure is a bonding ring 502 connected to the ground leads 110 by the first downsets 112. In turn, the frame paddle 106 is connected to the bonding ring 502 by second downsets 504 connected at the corners of the frame paddle 106 and the bonding ring 502, rather than mid-length as illustrated for the second downsets 114 (FIG. 1) in the leadframe 100 (FIG. 1).

Residual force release and stress relief are then provided by corner slots 506 and W-links 508. The corner slots 506 function similarly as the box slots 312 (FIG. 3), and are located on the bonding ring 502 between the attachment points for the first downsets 112 and the second downsets 504. The W-links 508 function similarly as the Z-links 310 (FIG. 3) in the leadframe 300 (FIG. 3), and are located on the ends of the major extents 510 of the bonding ring 502. The major extents 510 of the bonding ring 502, as illustrated, are the portions of the bonding ring 502 that are intermediate the connections of the bonding ring 502 with the first downsets 112 and the second downsets 504.

Figure 6:
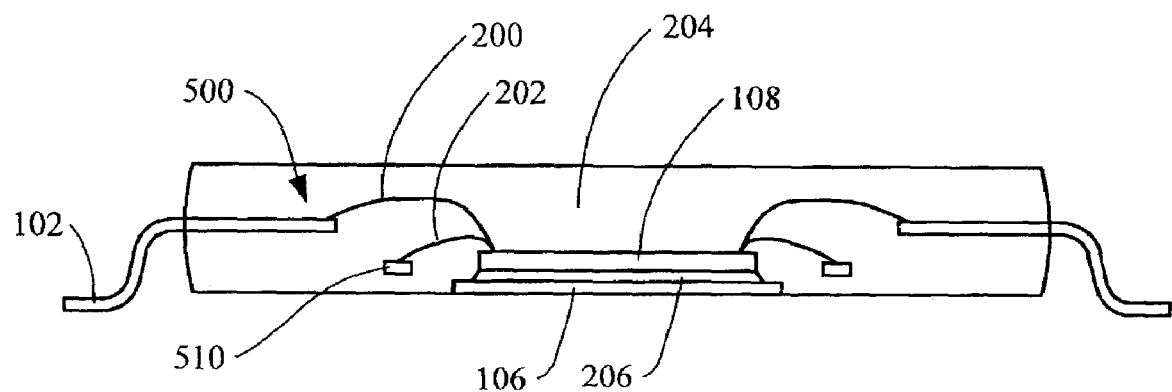
FIG. 6 is a cross-sectional view of the structure of FIG. 5 taken generally on line 6—6 of FIG. 5.

Referring now to FIG. 6, therein is shown a cross-sectional view of the structure of FIG. 5, taken generally on line 6—6 thereof. In addition, FIG. 6 illustrates the full extent of the signal leads 102, and shows the leadframe 500 in a final state of manufacture in which the signal wires 200 have been bonded to the signal leads 102 and connected to the die 108, the ground wires 202 have been bonded to the major extents 510 of the bonding ring 502 (FIG. 5) and connected to the die 108, and the encapsulating body 204 has been formed therearound.

Figure 7:
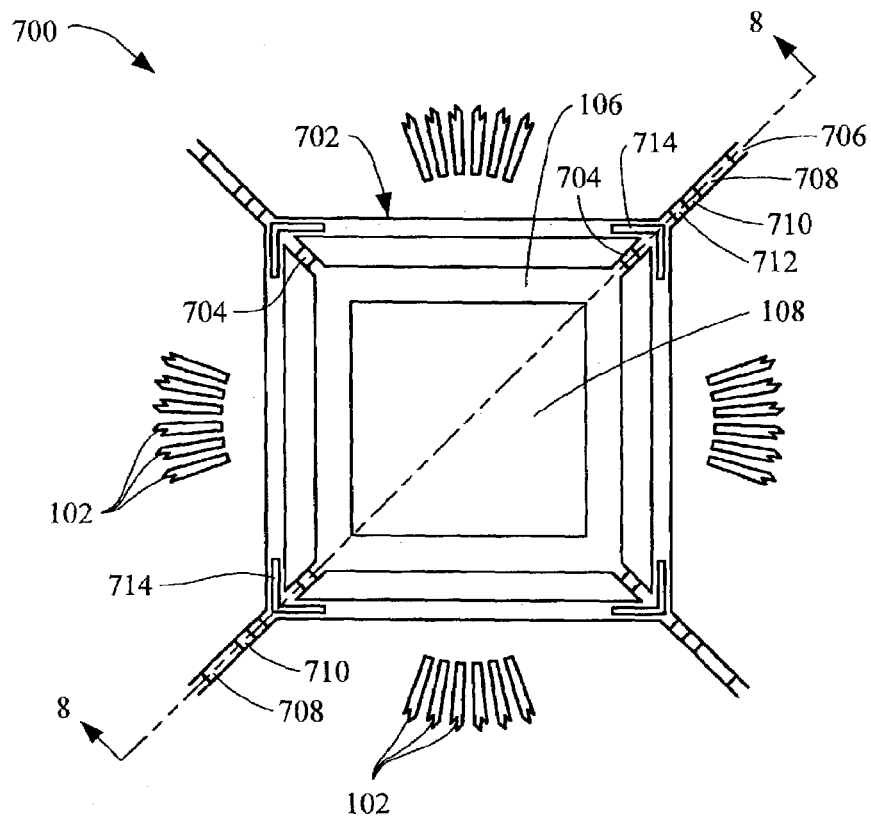
FIG. 7 is a plan view of a leadframe illustrating still another embodiment incorporating force release and stress relief features according to the present invention.

Referring now to FIG. 7, therein is shown a leadframe 700, illustrating still another leadframe embodiment incorporating force release and stress relief features according to the present invention. The leadframe 700 includes a bonding ring 702 connected by downsets 704 to the frame paddle 106. Ground leads 706 in this configuration include a deep downset 708 connecting downwardly to a foot 710 that is on the same level or plane as the frame paddle 106. The bonding ring 702 is then connected to the foot 710 by a downset 712 therebetween.

The force release and stress relief features of the leadframe 700 include corner L-slots 714 and the pair of downsets 704 and 712. The corner L-slots 714, being located in the corner regions where the downsets 704 and 712 are attached to the bonding ring 702, provide stress relief similarly as the corner slots 506 (FIG. 5) in the leadframe 500 (FIG. 5). The downsets 704 and 712 provide stress relief by presenting symmetrical metal formation patterns on opposing sides of the bonding ring 702, in a pair-wise fashion, reducing the tendency of the metal forming and stamping operations to twist or warp the bonding ring 702 in these areas.

Figure 8:
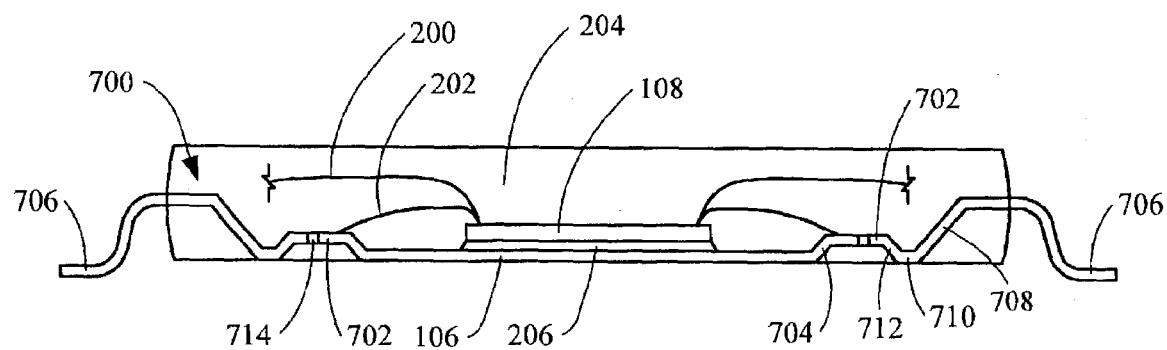
FIG. 8 is a cross-sectional view of the structure of FIG. 7 taken generally on line 8—8 of FIG. 7.

Referring now to FIG. 8, therein is shown a cross-sectional view of the structure of FIG. 7, taken generally on line 8—8 thereof. In addition, FIG. 8 illustrates the full extent of the ground leads 706, and shows the leadframe 700 in a final state of manufacture in which the signal wires 200 have been bonded to the signal leads 102 (FIG. 7) and connected to the die 108, the ground wires 202 have been bonded to the bonding ring 702 and connected to the die 108, and the encapsulating body 204 has been formed therearound.

Figure 9:
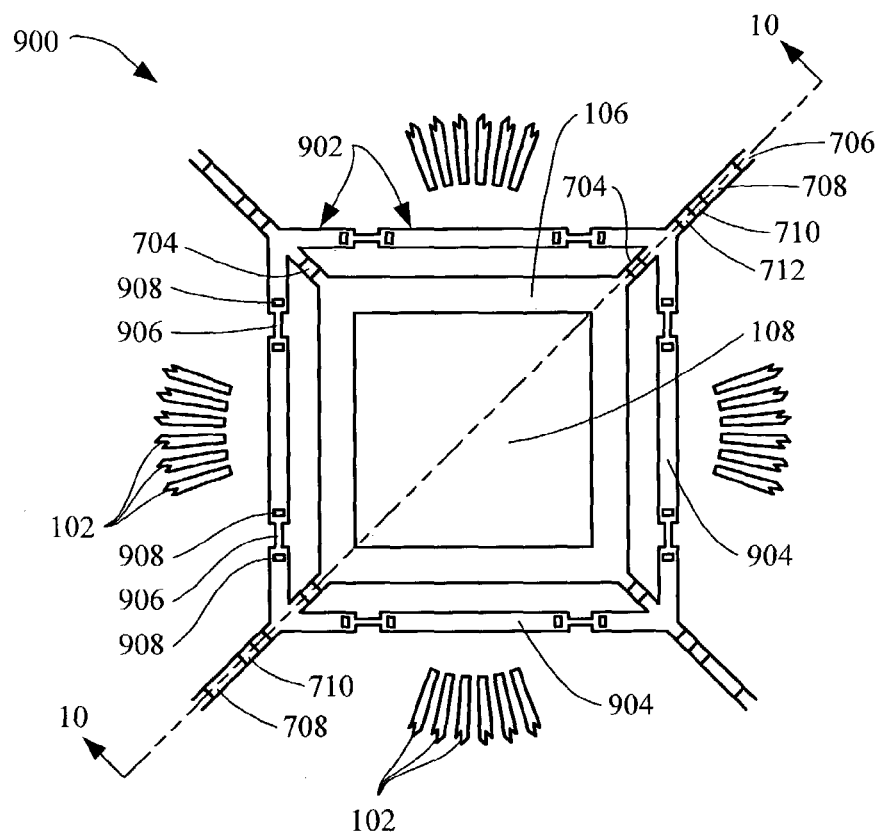
FIG. 9 is a plan view of a leadframe incorporating further additional features for force release and stress relief according to the present invention.

Referring now to FIG. 9, therein is shown a leadframe 900 that incorporates still additional features for force release and stress relief according to the teachings of the present invention. As in the leadframe 700 (FIG. 7), the leadframe 900 also has the symmetrical downsets 704 and 712 on opposite sides of a bonding ring 902, to reduce the incentive for the bonding ring 902 to warp following the metal forming operations for the leadframe 900. In addition, near each end of the major extents 904 of the bonding ring 902, at the attachments thereof to the ground leads 706, there are slim linkages 906 proximate to holes 908. By reducing the transverse width of the metal material of the bonding ring 902 at the slim linkages 906 and the holes 908, force release and stress relief are provided at these locations similarly as with the open rings 116 (FIG. 1) and the necks 120 (FIG. 1).

That is, the material in the immediate vicinity of the slim linkages 906 and the holes 908 is less able to resist yielding to residual stresses from the metal formation process, so the material will yield preferentially in these narrower extent regions, allowing the major extents 904 of the bonding ring 902 to release stresses and return to the normal, preferred, planar configuration.

Figure 10:
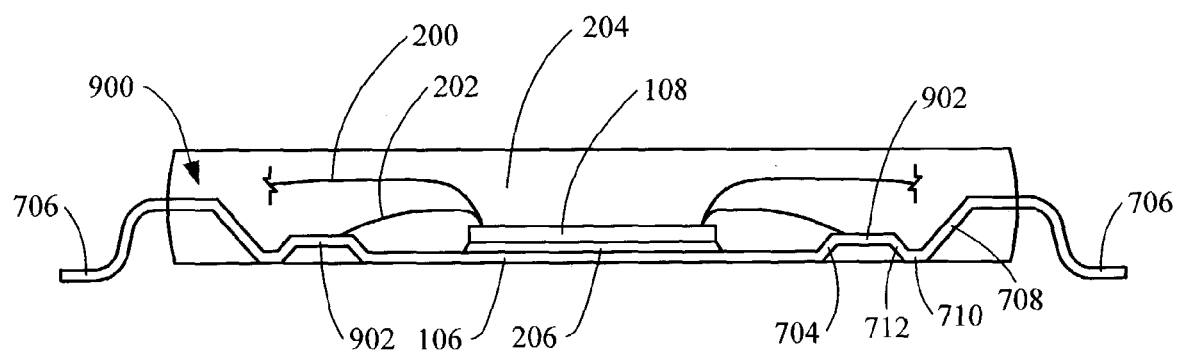
FIG. 10 is a cross-sectional view of the structure of FIG. 9 taken generally on line 10—10 of FIG. 9.

Referring now to FIG. 10, therein is shown a cross-sectional view of the structure of FIG. 9, taken generally on line 10—10 thereof. In addition, FIG. 10 illustrates the full extent of the ground leads 706, and shows the leadframe 900 in a final state of manufacture in which the signal wires 200 have been bonded to the signal leads 102 (FIG. 9) and connected to the die 108, the ground wires 202 have been bonded to the bonding ring 902 and connected to the die 108, and the encapsulating body 204 has been formed therearound.

Thus, it has been discovered that the integrated circuit leadframe with ground plane of the present invention furnishes important and heretofore unavailable solutions, capabilities, and functional advantages. Principally, the ground plane attachment rings and tabs of the present invention are freed from distortion and warpage resulting from residual mechanical stresses imposed by the downsetting and upsetting manufacturing steps, and the associated mechanical pushing of the various leadframe components to different levels, during multi-plane leadframe fabrication. As disclosed and described, this is accomplished by incorporation of the various inventive force release and stress relief features as appropriate to the needs at hand. The resulting leadframe configurations are straightforward, economical, uncomplicated, highly versatile and effective, and are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth herein or shown in the accompanying drawings are to be interpreted in an illustrative and non-limiting sense.

The invention claimed is:

1. A leadframe for a semiconductor package, comprising:
   signal and ground leads;
   a ground plane configured for direct connection to ground wires from a die;
   a frame paddle;
   supports connecting the signal and ground leads, ground plane, and frame paddle in at least two different layers; and
   at least one force release and stress relief structure incorporated into the leadframe to free the ground plane substantially from distortion and warpage resulting from residual mechanical stresses therein.

2. The leadframe of claim 1 wherein the force release and stress relief structure further comprises at least one slot formed in the ground plane substantially adjacent a support connected thereto.

3. The leadframe of claim 1 wherein the force release and stress relief structure further comprises at least one link of reduced transverse extent formed in the ground plane near at least one of the supports connected thereto.

4. The leadframe of claim 3 wherein the force release and stress relief link further comprises a structure selected from the group consisting of Z-links, W-links, necks, slim linkages, open rings, holes, and a combination thereof.

5. The leadframe of claim 1 wherein the force release and stress relief structure further comprises a region of narrowed transverse extent formed in a ground lead.

6. The leadframe of claim 5 wherein the region of narrowed transverse extent further comprises a box slot.

7. The leadframe of claim 1 wherein the force release and stress relief structure further comprises supports connected symmetrically to the ground plane on opposite sides thereof.

8. The leadframe of claim 7 wherein the supports further comprise downsets connected to the ground plane.

9. The leadframe of claim 1 wherein the ground plane further comprises a bonding ring.

10. The leadframe of claim 1 wherein the ground plane further comprises tabs.

11. A semiconductor package, comprising:
    a leadframe having:
        signal and ground leads;
        a ground plane connected to a plurality of the pound leads;
        a frame paddle;
        supports connecting the signal and ground leads, ground plane, and frame paddle in at least three different layers; and
        force release and stress relief structures incorporated into the leadframe to free the ground plane substantially from distortion and warpage resulting from residual mechanical stresses therein;
    a semiconductor die located on the frame paddle;
    an adhesive securing the semiconductor die to the frame paddle;
    at least one ground wire connected between the semiconductor die and the ground plane;
    at least one signal wire connected between the semiconductor die and at least one of the signal leads; and
    an encapsulating body formed substantially around the leadframe, wires, and semiconductor die.

12. The package of claim 11 wherein the force release and stress relief structures further comprise slots formed in the ground plane adjacent supports connected thereto.

13. The package of claim 11 wherein the force release and stress relief structures further comprise links of reduced transverse extent formed in the ground plane near the supports connected thereto.

14. The package of claim 13 wherein the force release and stress relief links further comprise structures selected from the group consisting of Z-links, W-links, necks, slim linkages, open rings, holes, and a combination thereof.

15. The package of claim 11 wherein the force release and stress relief structures further comprise regions of narrowed transverse extent formed in the ground leads.

16. The package of claim 15 wherein the regions of narrowed transverse extent further comprise box slots.

17. The package of claim 11 wherein the force release and stress relief structures further comprise supports connected symmetrically to the ground plane on opposite sides thereof.

18. The package of claim 17 wherein the supports further comprise downsets connected to the ground plane.

19. The package of claim 11 wherein the ground plane further comprises a bonding ring.

20. The package of claim 11 wherein the ground plane further comprises tabs.

* * * * *

UNITED STATES PATENT AND TRADEMARK OFFICE
CERTIFICATE OF CORRECTION

PATENT NO. : 7,064,420 B2  Page 1 of 1
APPLICATION NO. : 10/444849
DATED : June 20, 2006
INVENTOR(S) : Han et al.

It is certified that error appears in the above-identified patent and that said Letters Patent is hereby corrected as shown below:

Column 8, claim 11, line 21, delete "pound" and insert therefor --ground--

Signed and Sealed this

First Day of August, 2006

JON W. DUDAS
*Director of the United States Patent and Trademark Office*